United States Patent
Ho et al.

(10) Patent No.: US 8,300,395 B2
(45) Date of Patent: Oct. 30, 2012

(54) HOUSING AND ELECTRONIC DEVICE USING SAME

(75) Inventors: Po-Feng Ho, Shindian (TW); Guo-Yong Li, Shenzhen (CN); Tong-Ming Lan, Shenzhen (CN); Chang-Hai Gu, Shenzhen (CN); Qiu-Jiang Xu, Shenzhen (CN)

(73) Assignees: Shenzhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 205 days.

(21) Appl. No.: 12/902,217

(22) Filed: Oct. 12, 2010

(65) Prior Publication Data

US 2011/0216486 A1    Sep. 8, 2011

(30) Foreign Application Priority Data

Mar. 5, 2010 (CN) .......................... 2010 1 0118803

(51) Int. Cl.
*G06F 1/16* (2006.01)
(52) U.S. Cl. ........... 361/679.3; 361/679.01; 361/679.55; 361/679.56; 428/1.1; 428/1.31
(58) Field of Classification Search ................. 361/679.3
See application file for complete search history.

(56) References Cited

U.S. PATENT DOCUMENTS

| | | | | |
|---|---|---|---|---|
| 4,836,256 A * | 6/1989 | Meliconi | ...... | 206/523 |
| 5,175,873 A * | 12/1992 | Goldenberg et al. | ...... | 455/351 |
| 6,415,138 B2 * | 7/2002 | Sirola et al. | ...... | 455/90.1 |
| 6,659,274 B2 * | 12/2003 | Enners | ...... | 206/305 |
| 6,721,651 B1 * | 4/2004 | Minelli | ...... | 701/538 |
| 6,816,760 B1 * | 11/2004 | Namaky | ...... | 701/33.2 |
| 7,050,841 B1 * | 5/2006 | Onda | ...... | 455/575.8 |
| 7,599,018 B2 * | 10/2009 | Shen et al. | ...... | 349/58 |
| 7,684,178 B2 * | 3/2010 | Hsu et al. | ...... | 361/679.21 |
| 7,885,403 B2 * | 2/2011 | Fuhrmann et al. | ...... | 379/433.11 |
| 8,068,331 B2 * | 11/2011 | Sauers et al. | ...... | 361/679.01 |
| 2002/0101411 A1 * | 8/2002 | Chang | ...... | 345/179 |
| 2002/0195910 A1 * | 12/2002 | Hus et al. | ...... | 312/223.2 |
| 2006/0028572 A1 * | 2/2006 | Schmidt | ...... | 348/333.01 |
| 2008/0055258 A1 * | 3/2008 | Sauers | ...... | 345/173 |
| 2008/0227507 A1 * | 9/2008 | Joo | ...... | 455/575.8 |
| 2010/0008028 A1 * | 1/2010 | Richardson et al. | ...... | 361/679.01 |
| 2010/0053854 A1 * | 3/2010 | Nishikawa et al. | ...... | 361/679.01 |
| 2010/0164836 A1 * | 7/2010 | Liberatore | ...... | 345/1.1 |
| 2010/0200456 A1 * | 8/2010 | Parkinson | ...... | 206/701 |
| 2011/0090626 A1 * | 4/2011 | Hoellwarth et al. | ...... | 361/679.01 |
| 2011/0279961 A1 * | 11/2011 | Shedletsky et al. | ...... | 361/679.21 |

* cited by examiner

*Primary Examiner* — Anthony Q Edwards
(74) *Attorney, Agent, or Firm* — Altis Law Group, Inc.

(57) ABSTRACT

A housing includes a screen guard defining a transparent section, and a main body molded to the screen guard. The screen guard and the main body cooperatively define a cavity for accommodating electronic components of the electronic device.

14 Claims, 3 Drawing Sheets

HOUSING AND ELECTRONIC DEVICE USING SAME

BACKGROUND

1. Technical Field

The exemplary disclosure generally relates to housings, particularly to housings used in electronic devices.

2. Description of Related Art

Many housings, used with electronic devices, include a main body and a transparent screen guard. The main body and the screen guard are manufactured in separate molding processes then glued or otherwise fixed together. Over time the glue or other means may wear and allow dust and moisture to enter the housing, potentially damaging the electronic elements inside. Furthermore, because the main body and the screen guard are made in two separate processes and then connected in a separate step, assembly time is long and complicated and adds to the manufacturing burden.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary housing used in an electronic device. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
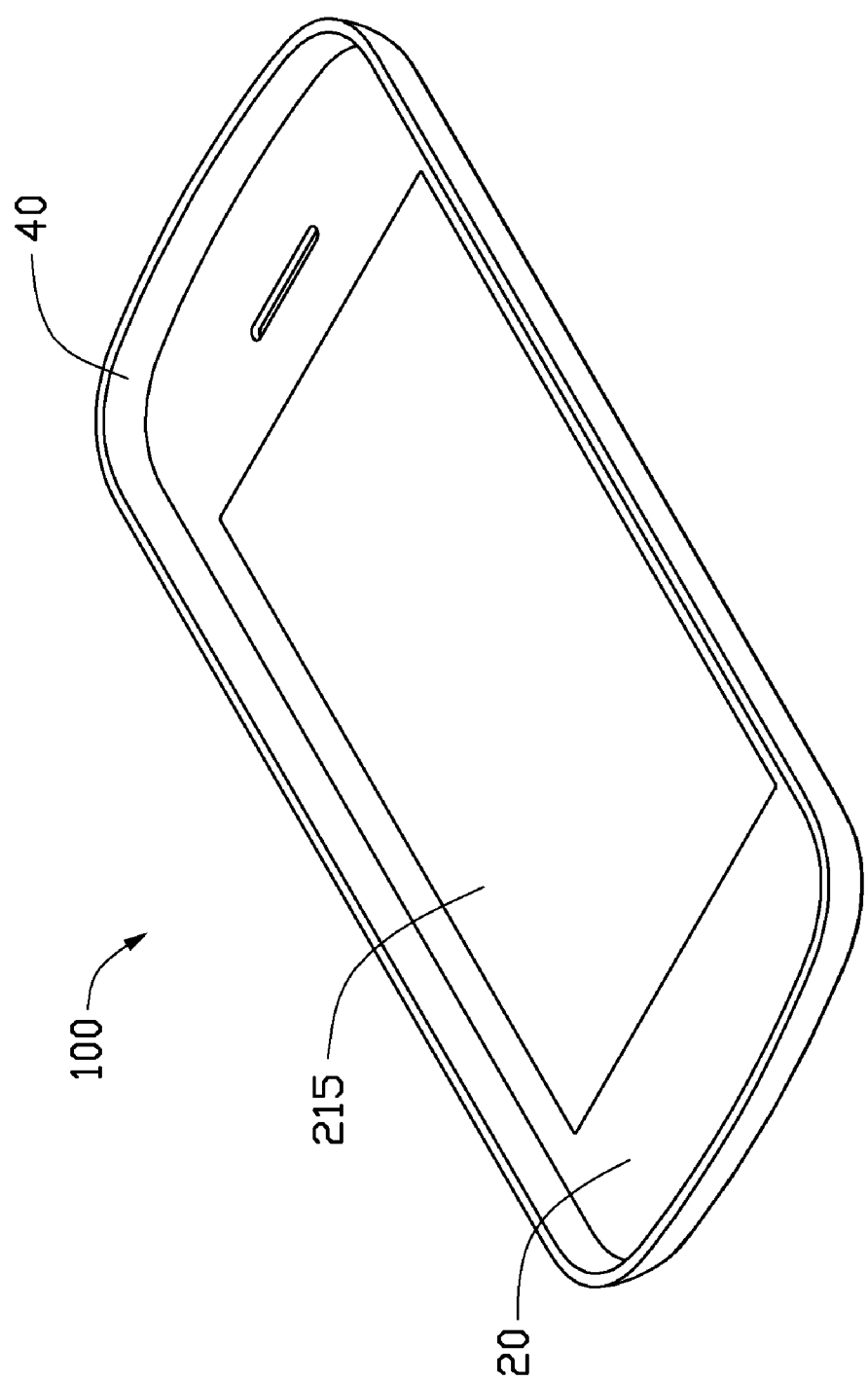
FIG. 1 is a schematic view of an exemplary embodiment of a housing including a main body and a screen guard.
Figure 3:
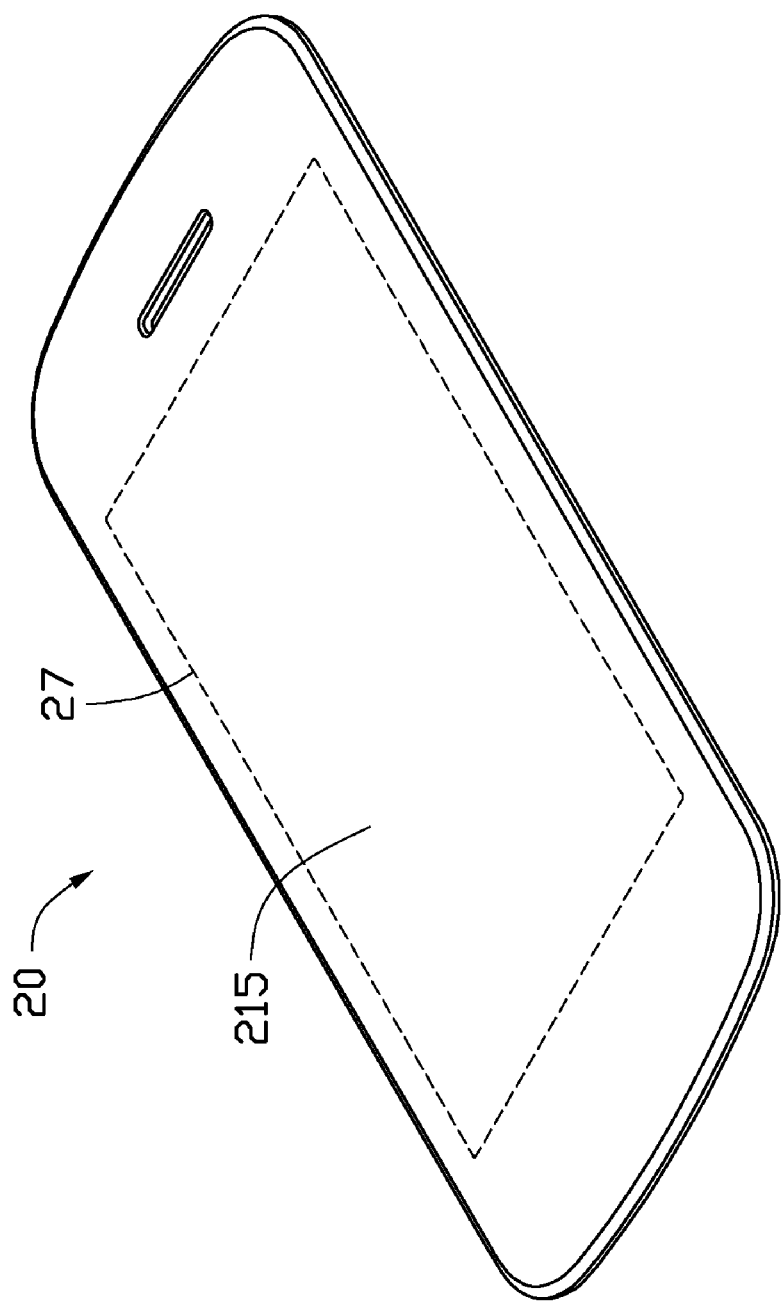
FIG. 3 is an enlarged and schematic view of the screen guard in FIG. 1 from another aspect.

FIGS. 1 and 3, show a portion of an electronic device 100, such as mobile phone. The electronic device 100 includes a housing (not labeled). The housing includes a screen guard 20, and a main body 40 molded to the screen guard 20. The screen guard 20 and the main body 40 cooperatively define a cavity 50 for accommodating electronic components of the electronic device. The housing further includes an adhesive 30 positioned between the main body 40 and the screen guard 20 prior to the main body 40 molding process to further strengthen the bond between the lens 20 to the main body 40. The adhesive 30 may be hot setting.

Figure 2:
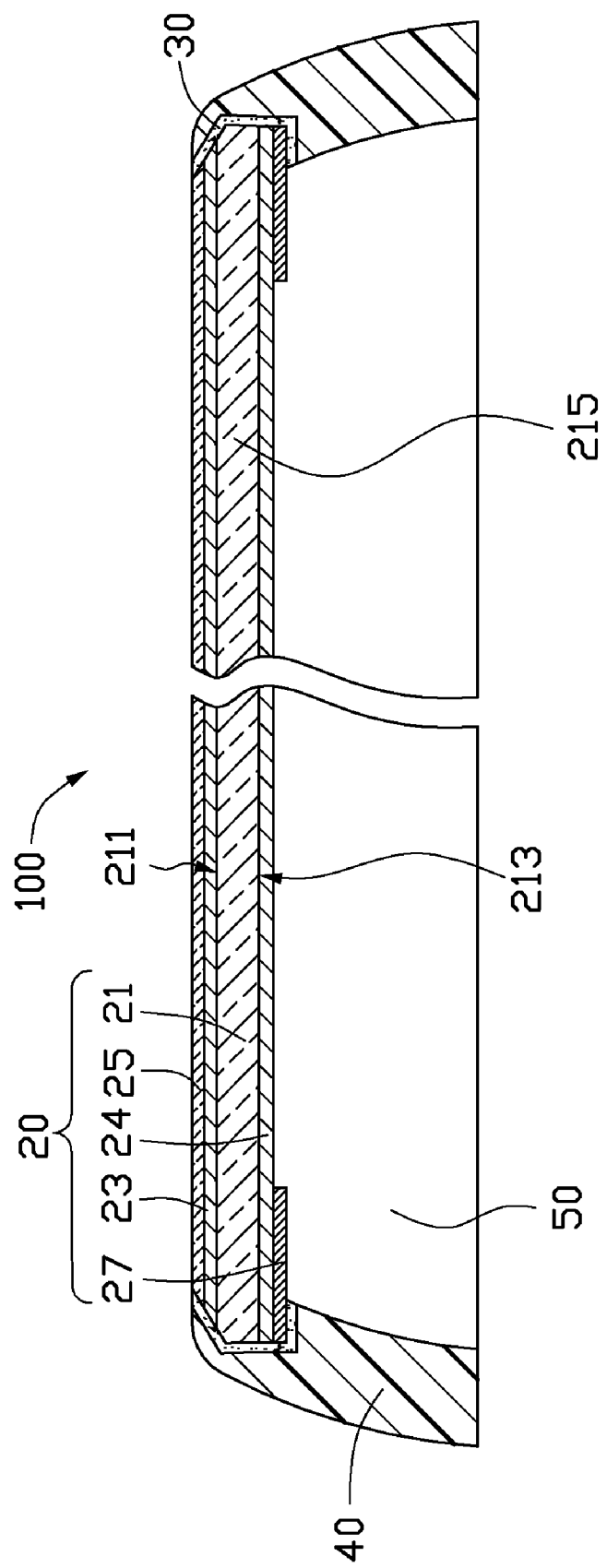
FIG. 2 is a cross-sectional view of the housing in FIG. 1.

Referring to FIGS. 2 and 3, the screen guard 20 includes a clear, transparent base 21, a first transparent strengthening layer 23, a second transparent strengthening layer 24, an anti-reflection layer 25 and a shading layer 27. The first transparent strengthening layer 23 is formed on and covers an outer surface 211 of the base 21. The anti-reflection layer 25 is formed on and covers one surface of the first transparent strengthening layer 23 opposite to the base 21. The second transparent strengthening layer 24 is formed on and covers an inner surface 213 of the base 21. The shading layer 27 may be opaque. The shading layer 27 is attached on a portion of an interior surface of the second transparent strengthening layer 24 opposite to the base 21, to define a displaying section 215 on an area of the screen guard 20 which is not shielded by the shading layer 27. It is understood that the second transparent strengthening layer 24 may be omitted, and the shading layer 27 may be directly attached to a portion of the inner surface 213 of the base 21 in applications not requiring so much strengthening.

The base 21 is made of a thermoplastic material such as Polycarbonate (PC), Polymethyl Methacrylate (PMMA), or any combination thereof. The first transparent strengthening layer 23 and the second transparent strengthening layer 24 are for improving the strength of the screen guard 20. The anti-reflection layer 25 is for reducing glare off of the screen guard 20. The shading layer 27 may be an ink film, a paint film, or a metallic film. The main body 40 is made of a thermoplastic material that has a heat-deformation temperature lower than the base 21, such as the combination of Polycarbonate (PC) and Acrylonitrile Butadiene Styrene (ABS). The screen guard 20 has a thickness ranging from about 0.5 millimeters to about 1.5 millimeters, and in this embodiment has a thickness ranging from about 1.0 millimeter to about 1.2 millimeter.

It is to be understood, however, that even through numerous characteristics and advantages of the exemplary disclosure have been set forth in the foregoing description, together with details of the system and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A housing for an electronic device, the housing comprising:
    a screen guard defining a transparent displaying section, the screen guard comprising a transparent base and a first transparent strengthening layer formed on and covering an outer surface of the base, a shading layer being attached on a portion of the base to define the displaying section, a second transparent strengthening layer being formed on and covering the inner surface of the base; the shading layer being attached on an interior surface of the second transparent strengthening layer opposite to the screen guard; and
    a main body integrally molded with and surrounding the screen guard, the screen guard and the main body cooperatively defining a cavity for accommodating electronic components of the electronic device.

2. The housing of claim 1, further comprising an adhesive positioned between the main body and the screen guard to adhere the screen guard to the main body.

3. The housing of claim 2, wherein the adhesive is hot setting.

4. The housing of claim 1, wherein an anti-reflection layer is formed on and covers one surface of the first transparent strengthening layer opposite to the base.

5. The housing of claim 1, wherein the base is made of Polycarbonate, Polymethyl Methacrylate, or any combination thereof.

6. The housing of claim 5, wherein the main body is made of a thermoplastic material that has a heat-deformation temperature lower than the base.

7. The housing of claim 6, wherein the main body is made of the combination of Polycarbonate and Acrylonitrile Butadiene Styrene.

8. The housing of claim 1, wherein the shading layer is ink film, painted film or metallic film.

9. The housing of claim 1, wherein the screen guard has a thickness ranging from about 0.5 millimeter to about 1.5 millimeter.

10. An electronic device, comprising:
a housing, comprising:
a screen guard defining a transparent displaying section, the screen guard comprising a transparent base and a first transparent strengthening layer formed on and covering an outer surface of the base, a shading layer being attached on a portion of the base to define the displaying section, a second transparent strengthening layer being formed on and covering the inner surface of the base; the shading layer being attached on an interior surface of the second transparent strengthening layer opposite to the screen guard; and
a main body integrally molded with and surrounding the screen guard, the screen guard and the main body cooperatively defining a cavity for accommodating electronic components of the electronic device.

11. The electronic device of claim 10, further comprising an adhesive positioned between the main body and the screen guard to adhere the screen guard to the main body.

12. The electronic device of claim 10, wherein an anti-reflection layer is formed on and covers one surface of the first transparent strengthening layer opposite to the base; the anti-reflection layer is for reducing reflection off of the screen guard.

13. The electronic device of claim 10, wherein the base is made of Polycarbonate, Polymethyl Methacrylate, or any combination thereof.

14. The electronic device of claim 10, wherein the main body is made of a thermoplastic material that has a heat-deformation temperature lower than the base.

* * * * *